(12) United States Patent
Kim et al.

(10) Patent No.: US 12,278,111 B2
(45) Date of Patent: *Apr. 15, 2025

(54) PLASMA ETCHING METHOD

(71) Applicant: AJOU UNIVERSITY INDUSTRY-ACADEMIC COOPERATION FOUNDATION, Suwon-si (KR)

(72) Inventors: Chang-Koo Kim, Seoul (KR); Jun-Hyun Kim, Seongnam-si (KR); Jin-Su Park, Suwon-si (KR)

(73) Assignee: AJOU UNIVERSITY INDUSTRY-ACADEMIC COOPERATION FOUNDATION, Suwon-si (KR)

(*) Notice: Subject to any disclaimer, the term of this patent is extended or adjusted under 35 U.S.C. 154(b) by 216 days.

This patent is subject to a terminal disclaimer.

(21) Appl. No.: 17/623,804

(22) PCT Filed: Jun. 1, 2020

(86) PCT No.: PCT/KR2020/007074
§ 371 (c)(1),
(2) Date: Dec. 29, 2021

(87) PCT Pub. No.: WO2021/033884
PCT Pub. Date: Feb. 25, 2021

(65) Prior Publication Data
US 2022/0246439 A1 Aug. 4, 2022

(30) Foreign Application Priority Data
Aug. 20, 2019 (KR) .................. 10-2019-0101473

(51) Int. Cl.
H01L 21/3065 (2006.01)
C09K 13/00 (2006.01)
(Continued)

(52) U.S. Cl.
CPC .......... *H01L 21/3065* (2013.01); *C09K 13/00* (2013.01); *H01J 37/3244* (2013.01);
(Continued)

(58) Field of Classification Search
None
See application file for complete search history.

(56) References Cited

U.S. PATENT DOCUMENTS 10,865,343 B2 * 12/2020 Kim .................. H01L 21/31144
2009/0017259 A1    1/2009 Nakagawa et al.
(Continued)

FOREIGN PATENT DOCUMENTS

KR  10-2000-0053068 A   8/2000
KR  10-2017-0076737 A   7/2017
(Continued)

OTHER PUBLICATIONS

H. Xiao, Introduction to Semiconductor Manufacturing Technology, SPIE Press, ISBN 978-0-8194-9092-6, pp. 341-362. (Year: 2012).*
(Continued)

*Primary Examiner* — Jiong-Ping Lu
(74) *Attorney, Agent, or Firm* — Sughrue Mion, PLLC

(57) ABSTRACT

A plasma etching method includes a first step of supplying a mixed gas containing vaporized heptafluoroisopropyl methyl ether gas having a molecular structure of a following Chemical Formula 1 or vaporized heptafluoropropyl methyl ether gas having a molecular structure of a following Chemical Formula 2 and argon gas into a plasma chamber in which an etching target is disposed; and a second step of etching the etching target using plasma generated from the mixed gas:

(Continued)

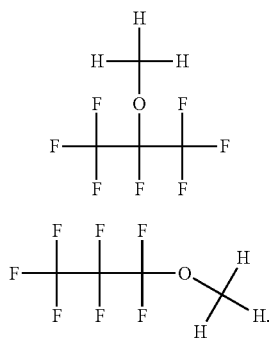

<Chemical Formula 1>

<Chemical Formula 2>

9 Claims, 14 Drawing Sheets

(51) Int. Cl.
*H01J 37/32* (2006.01)
*H01L 21/02* (2006.01)
*H01L 21/311* (2006.01)
*H01L 21/3213* (2006.01)

(52) U.S. Cl.
CPC .... *H01L 21/02126* (2013.01); *H01L 21/0214* (2013.01); *H01L 21/02164* (2013.01); *H01L 21/311* (2013.01); *H01L 21/31116* (2013.01); *H01L 21/31144* (2013.01); *H01L 21/32135* (2013.01); *H01L 21/32136* (2013.01); *H01J 2237/334* (2013.01); *Y02C 20/30* (2013.01)

(56) References Cited

U.S. PATENT DOCUMENTS

2012/0298911 A1  11/2012  Hibino et al.
2019/0027368 A1*  1/2019  Matsuura .......... H01L 21/31116

FOREIGN PATENT DOCUMENTS

KR  10-2018-0124030 A  11/2018
KR  10-2020-0018897 A  2/2020

OTHER PUBLICATIONS

International Search Report for PCT/KR2020/007074 dated Sep. 4, 2020 [PCT/ISA/210].
Written Opinion for PCT/KR2020/007074 dated Sep. 4, 2020 [PCT/ISA/237].

* cited by examiner

[FIG. 1]
| Chemical structure | 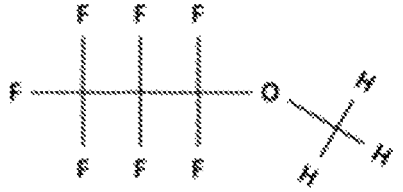 | 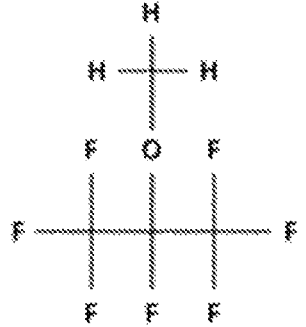 |
|---|---|---|
| Chemical name | Heptafluoropropyl methyl ether (HFE-347mcc3) | Hetalfluoroisopropyl methyl ether (HFE-347mmy) |
| Cas no. | 375-03-1 | 22052-84-2 |
| Molecular formula | $C_4H_3F_7O$ | $C_4H_3F_7O$ |
| M.W. (g/mol) | 200 | 200 |
| B.P. (°C) | 34.2 | 29.0 |
| Density (g/mL) | 1.409 @23°C | 1.420 @23°C |
| GWP | 530 | 343 |
| C/(F+O-H) | 0.8 | 0.8 |

[FIG. 2]
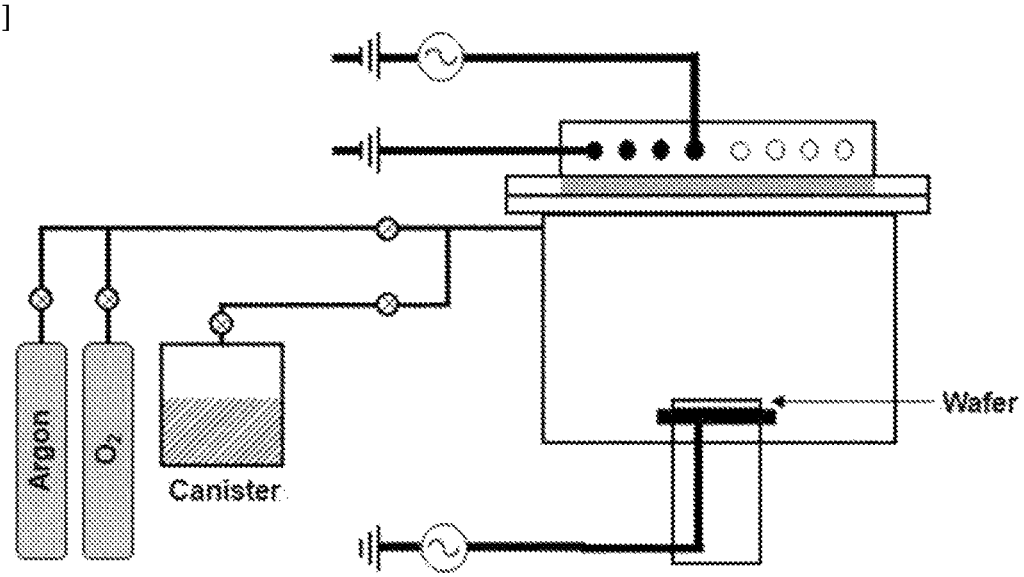

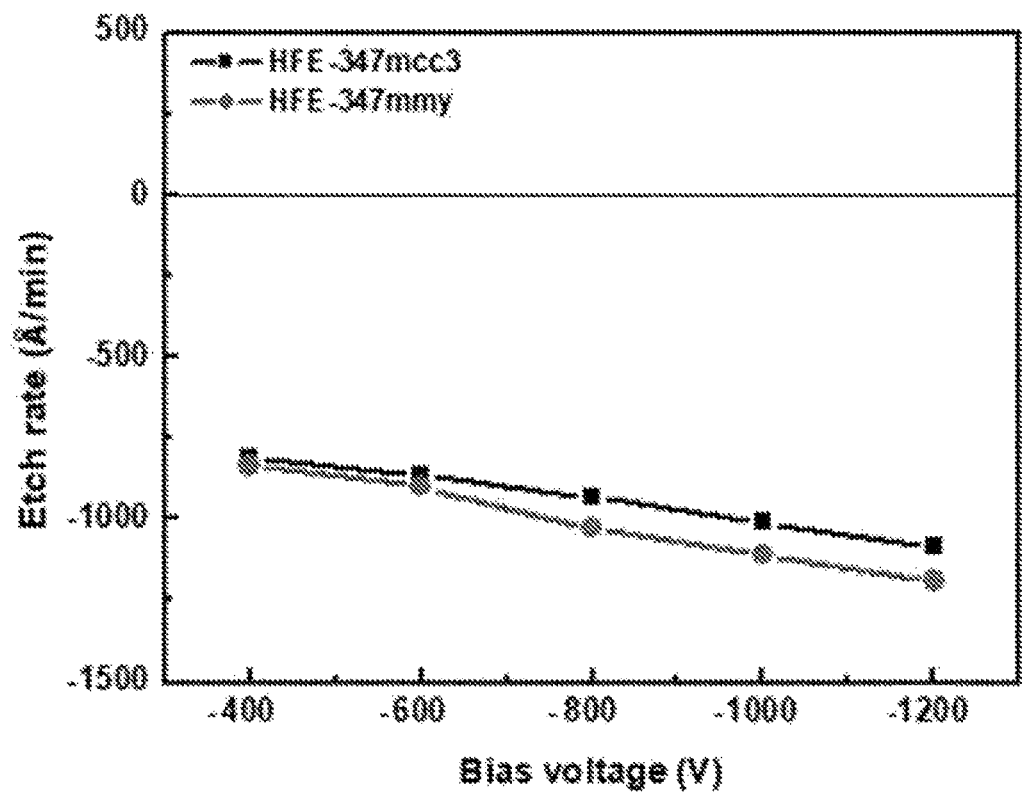

[FIG. 4]
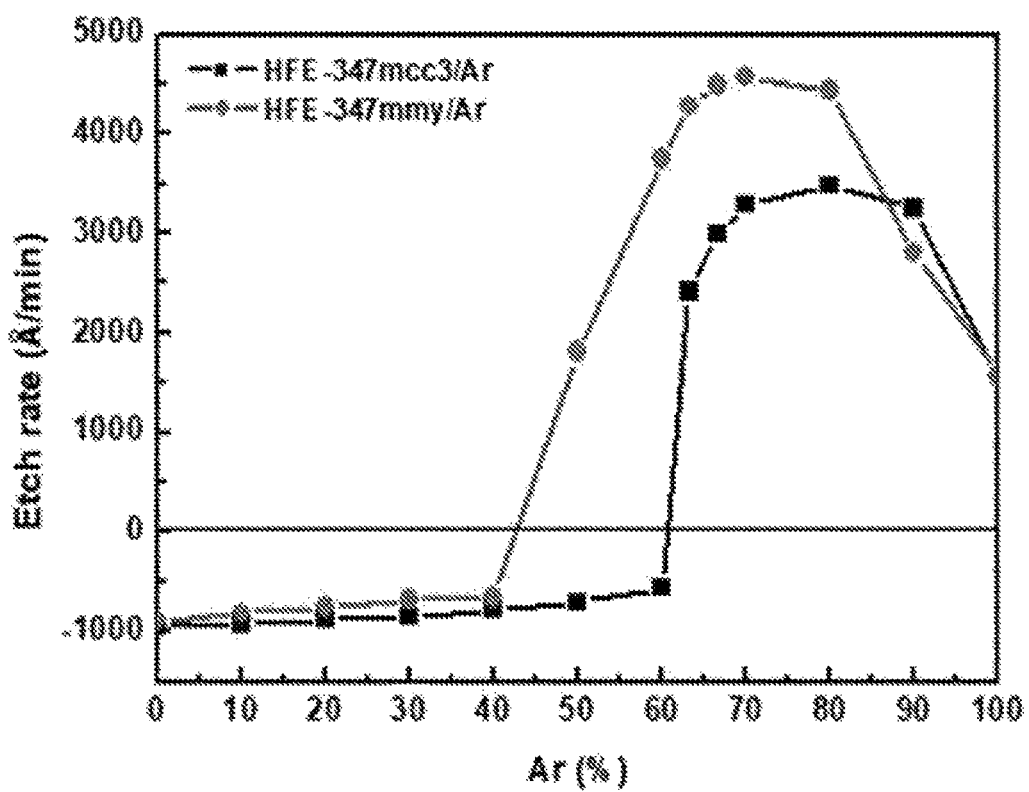

[FIG. 5]
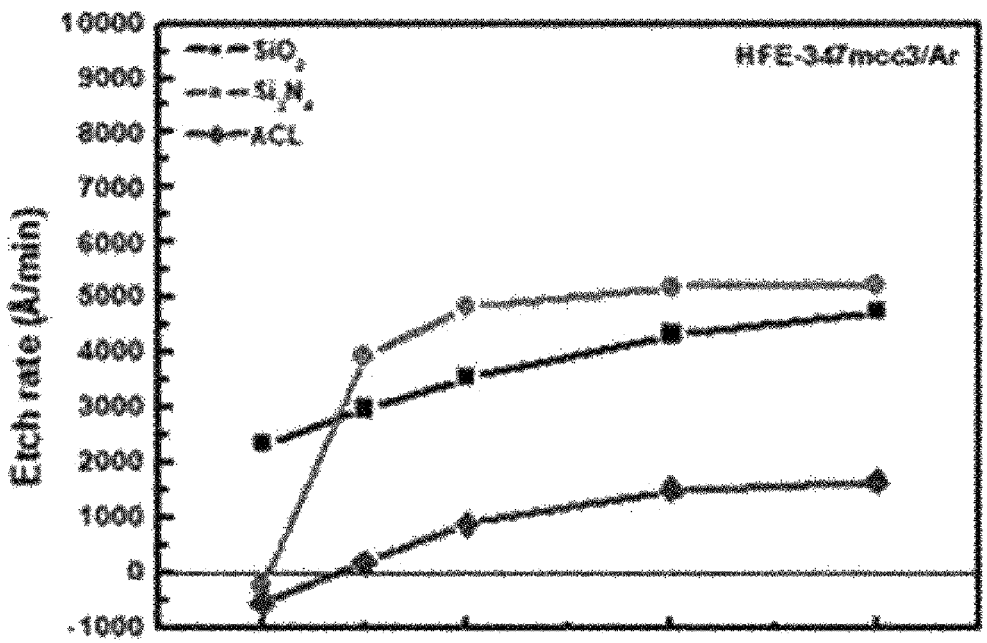
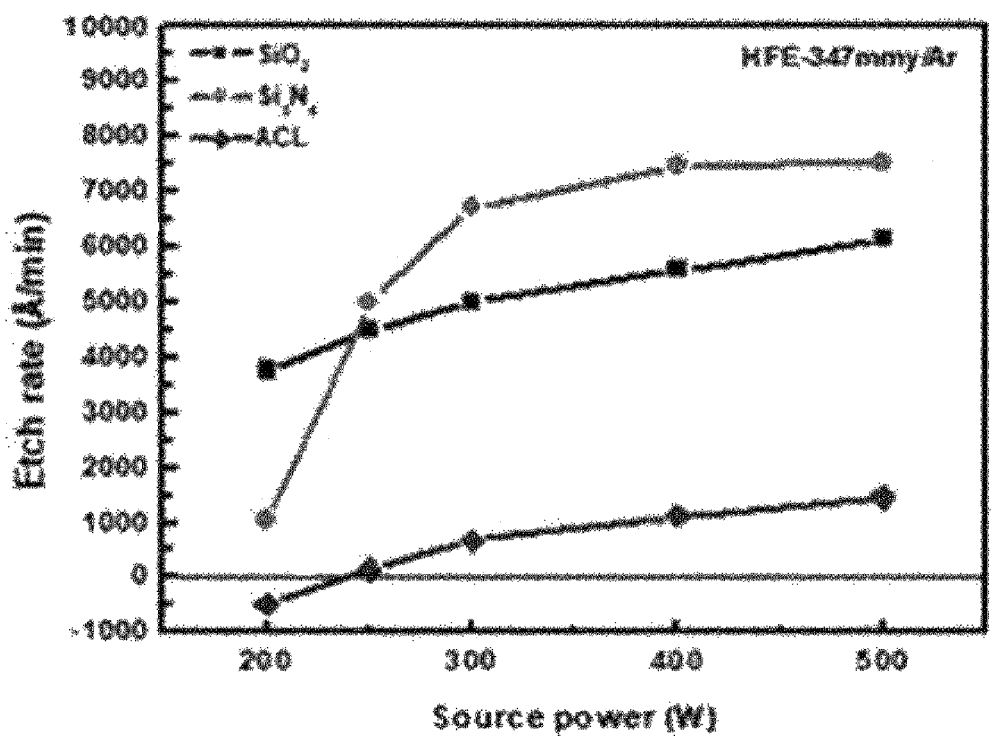

[FIG. 6]
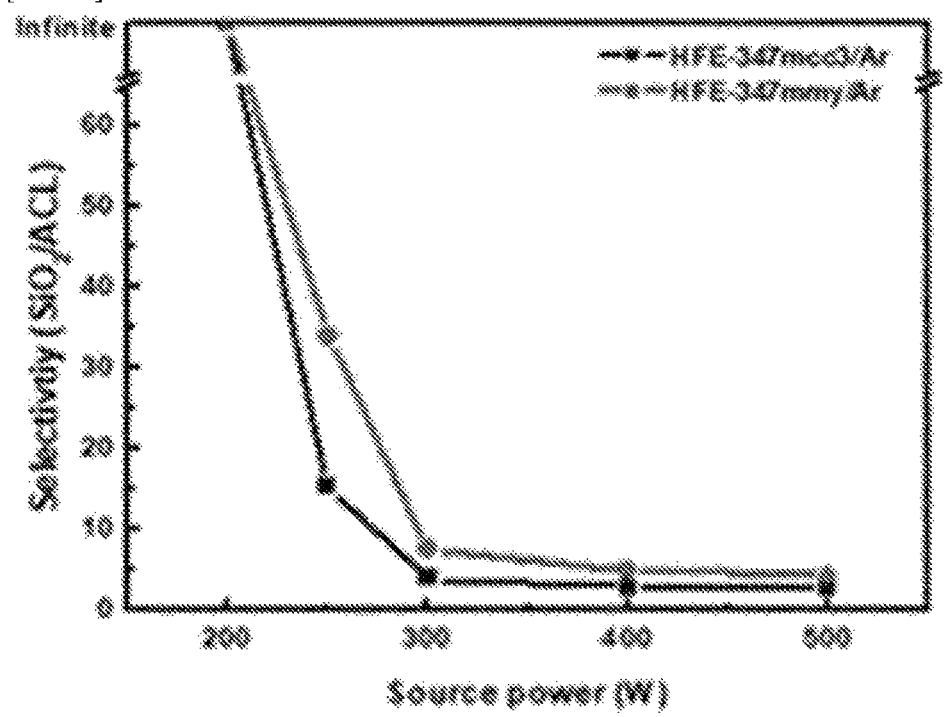
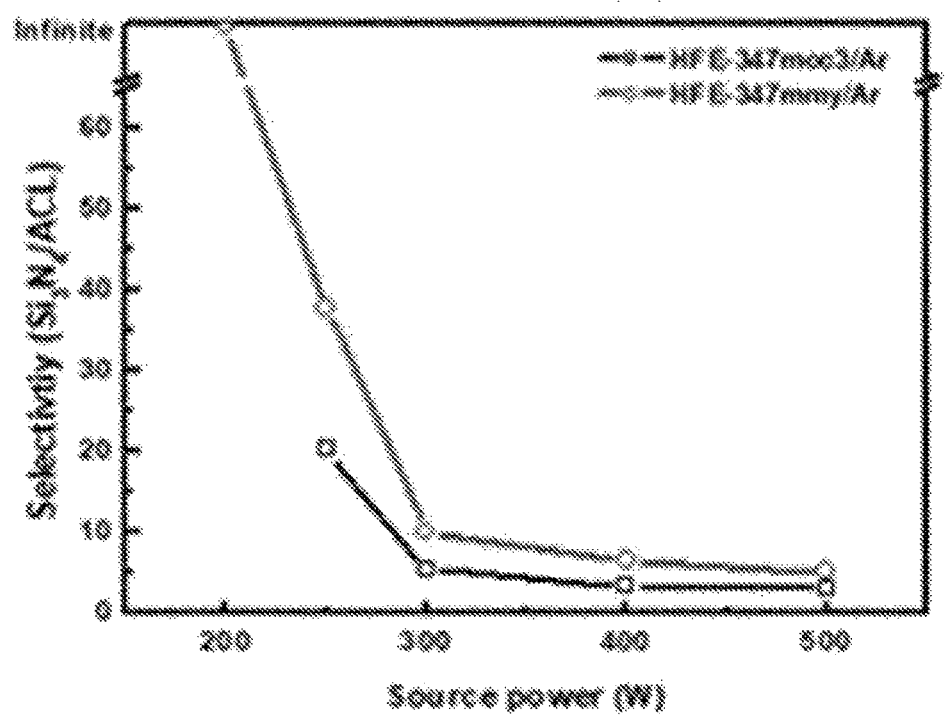

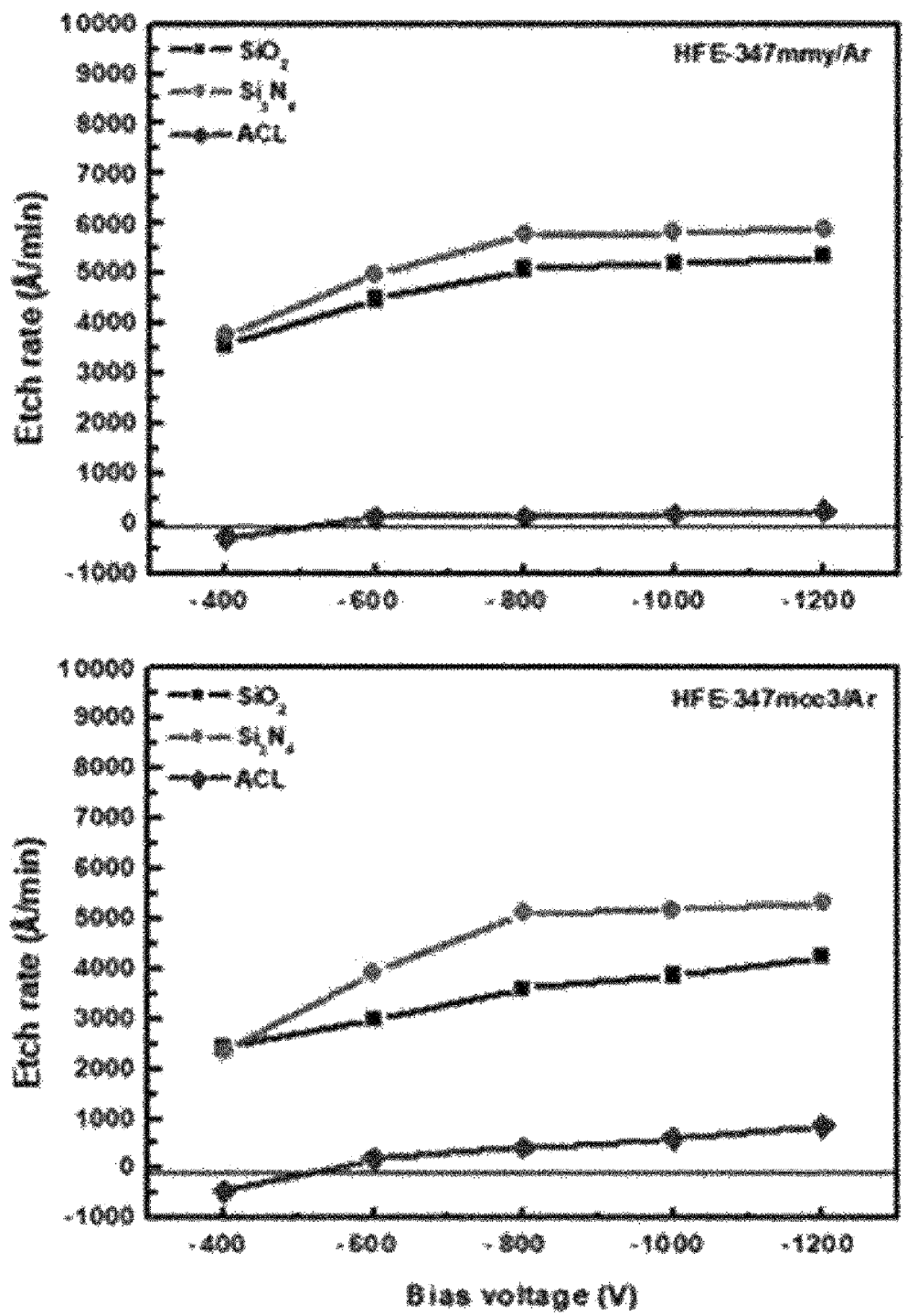
[FIG. 7]

[FIG. 8]
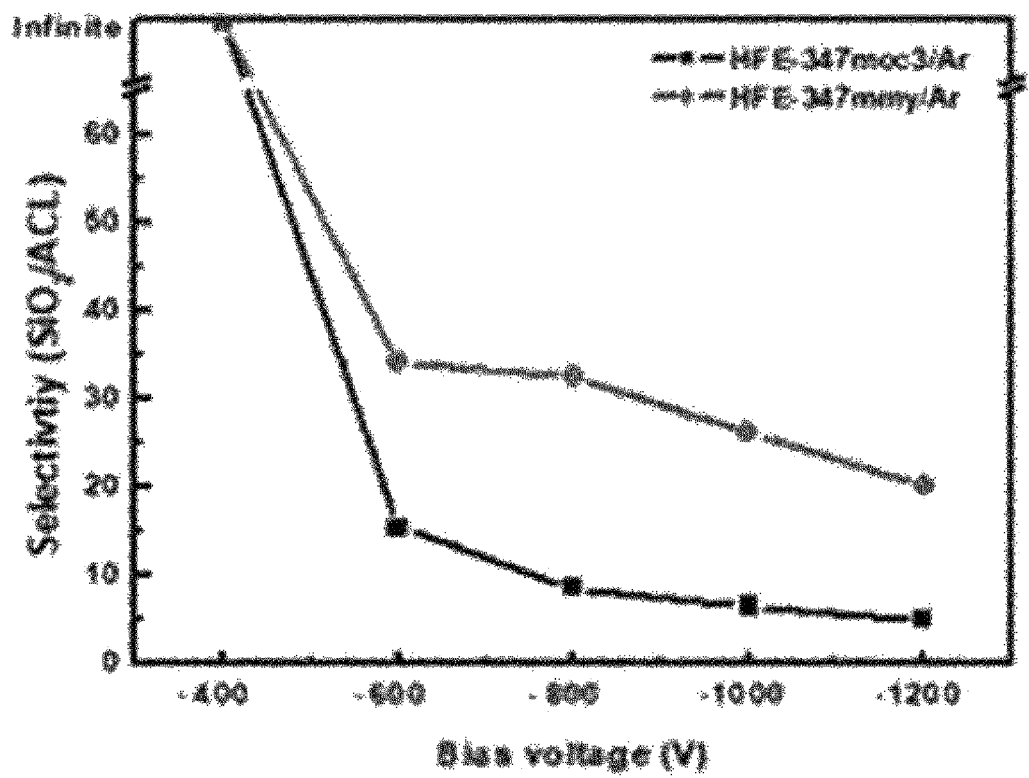
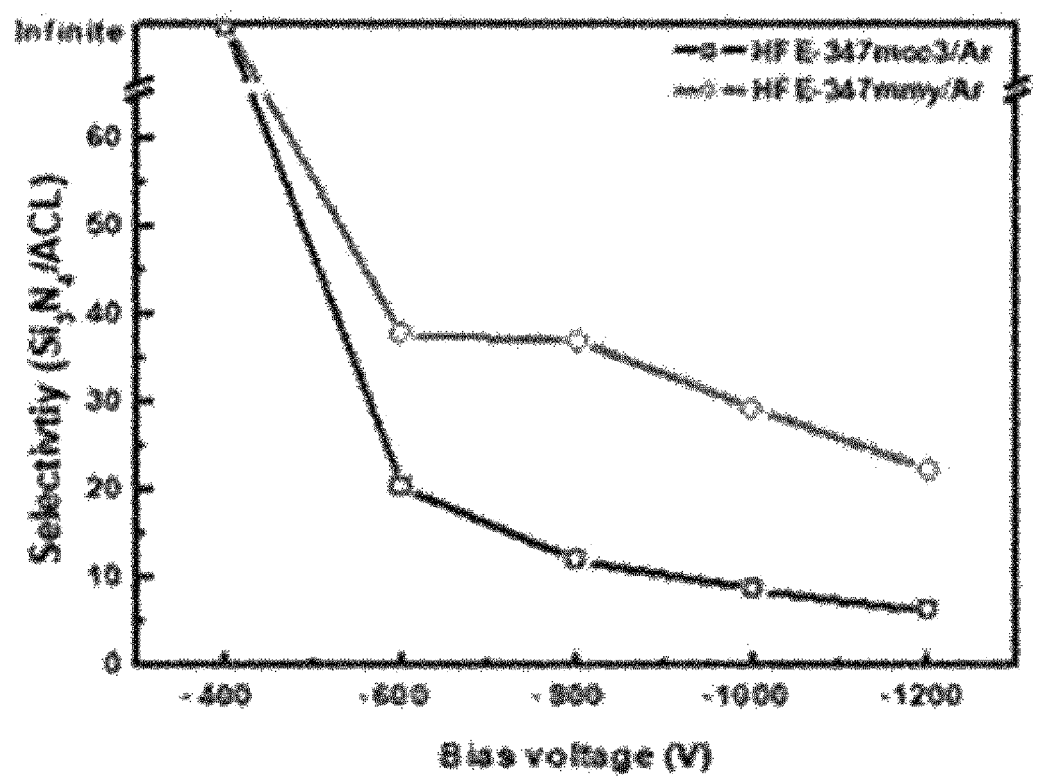

[FIG. 9]
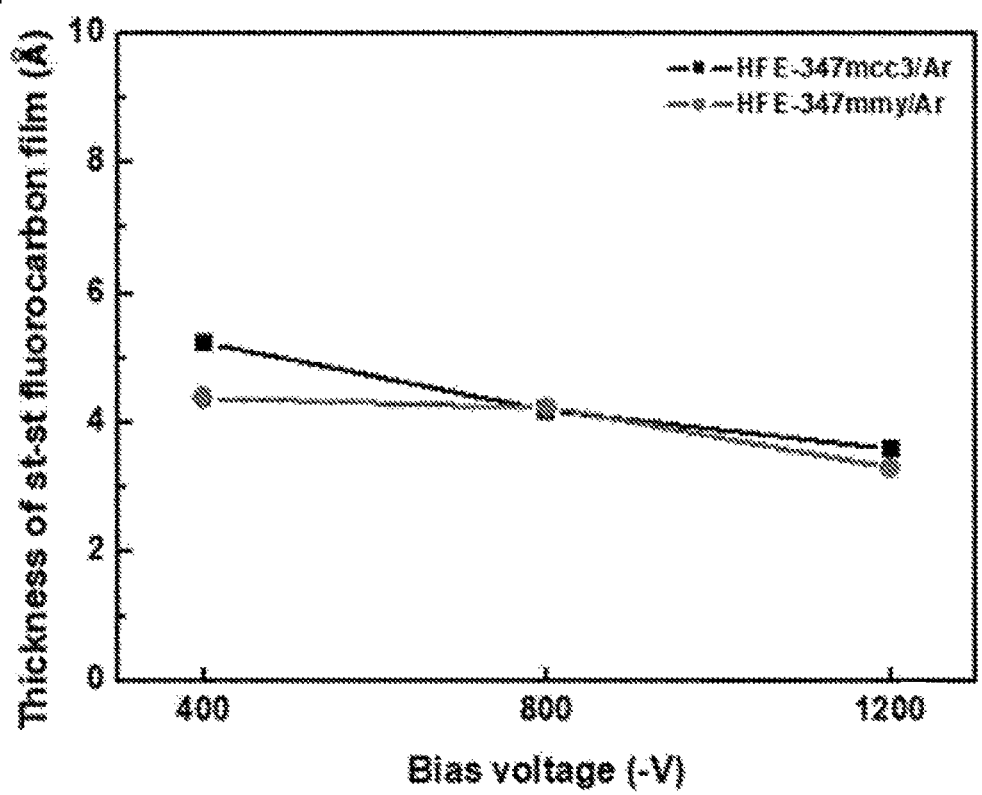

[FIG. 10]
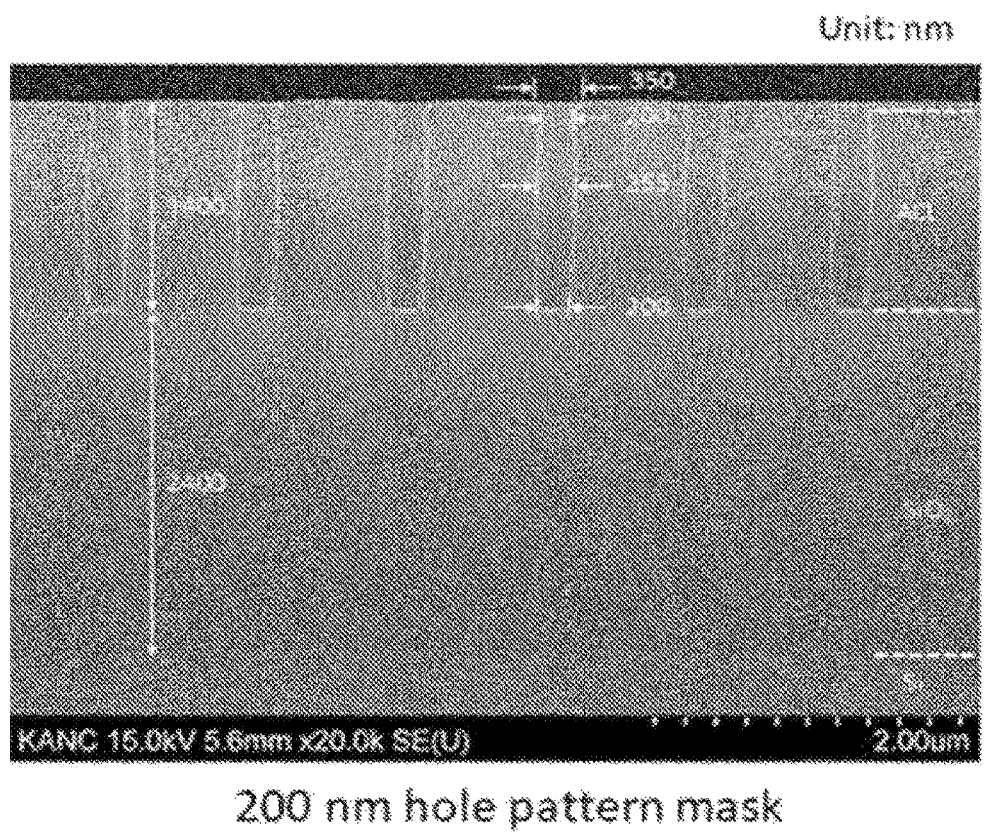
200 nm hole pattern mask

[FIG. 11A]
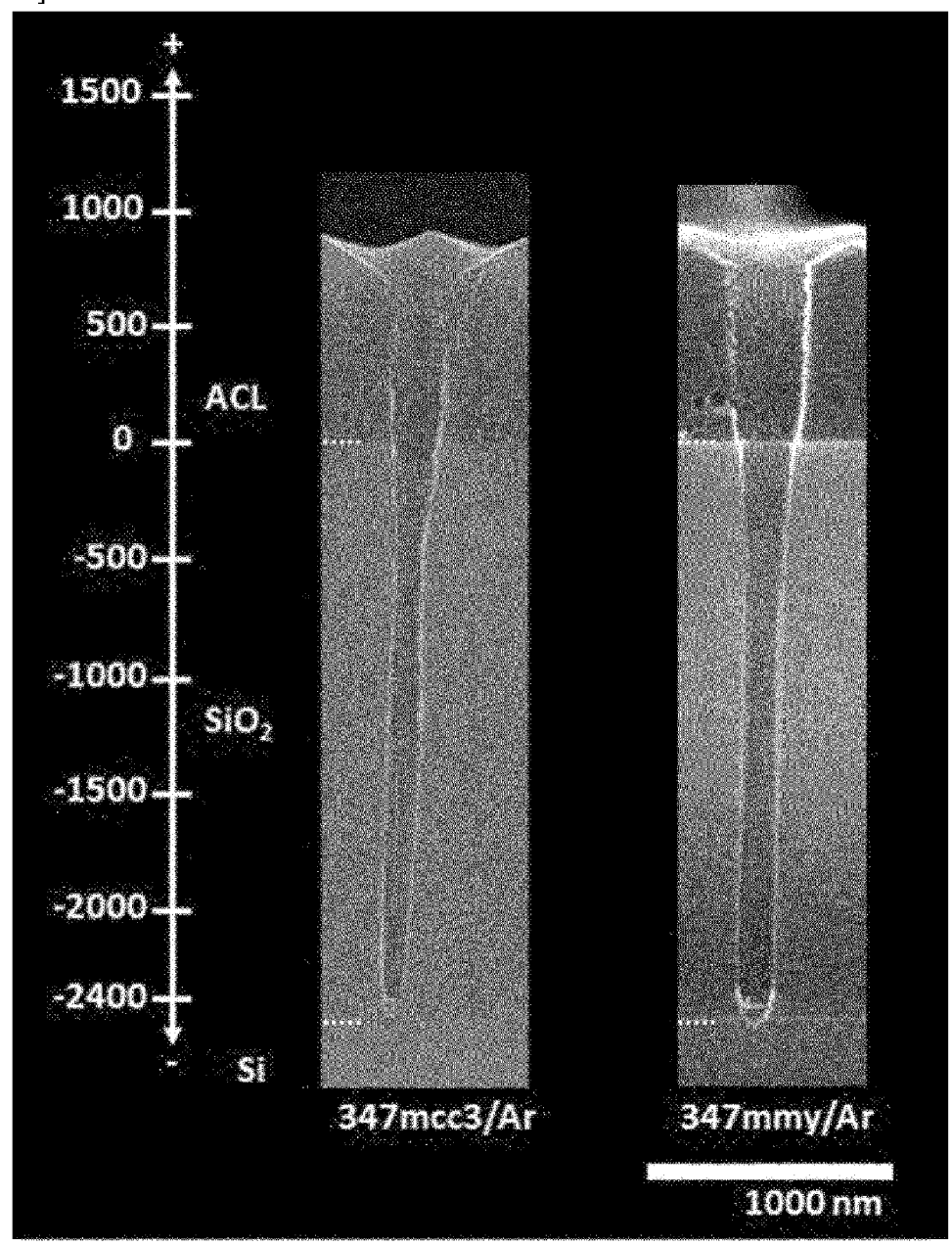

[FIG. 11B]
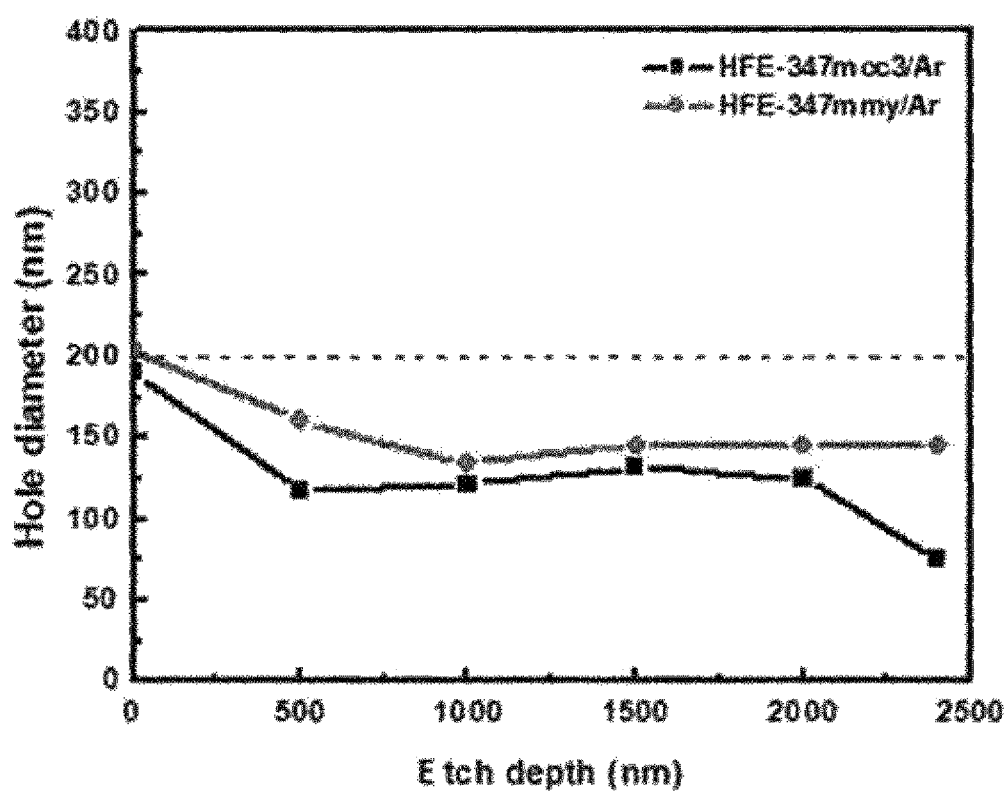

[FIG. 12A]
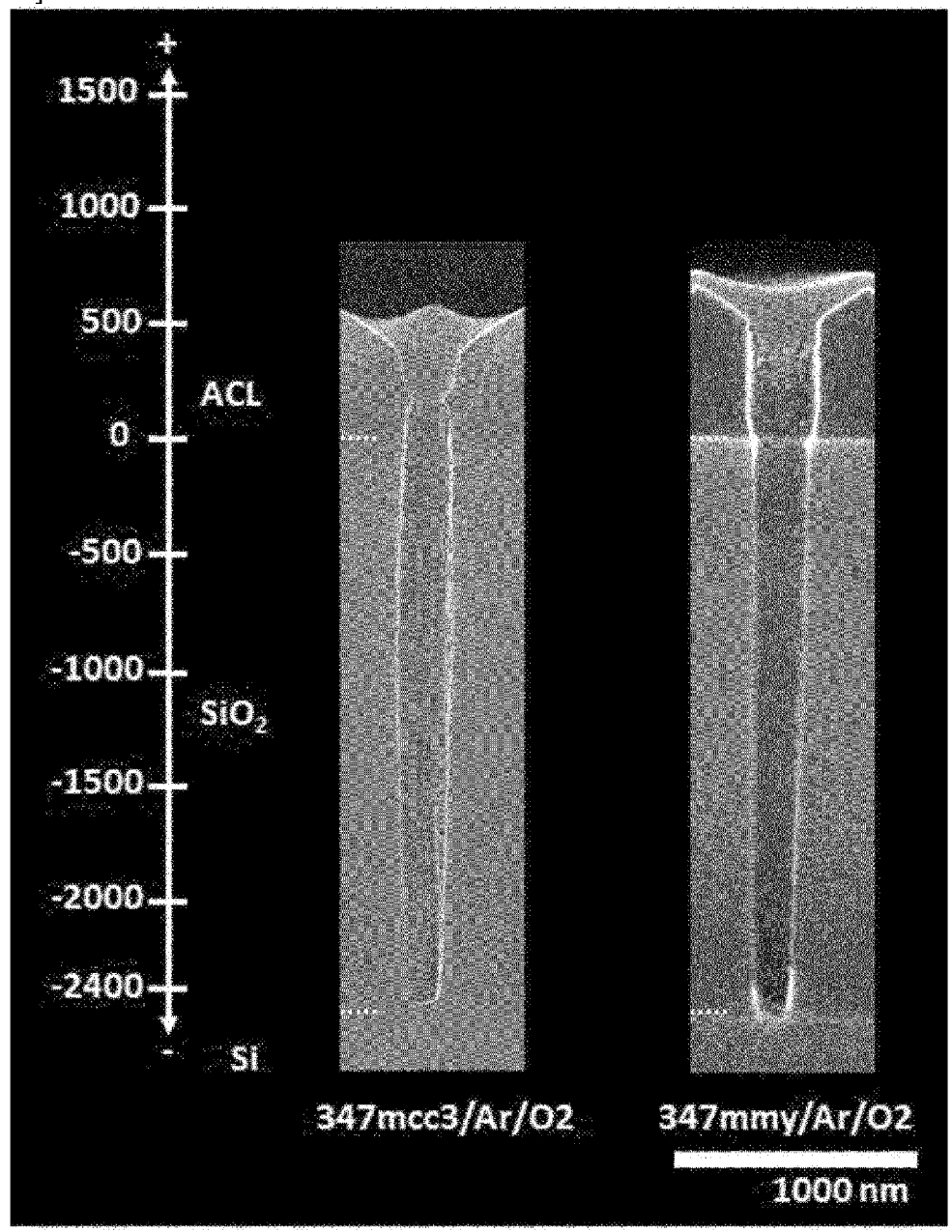

[FIG. 12B]
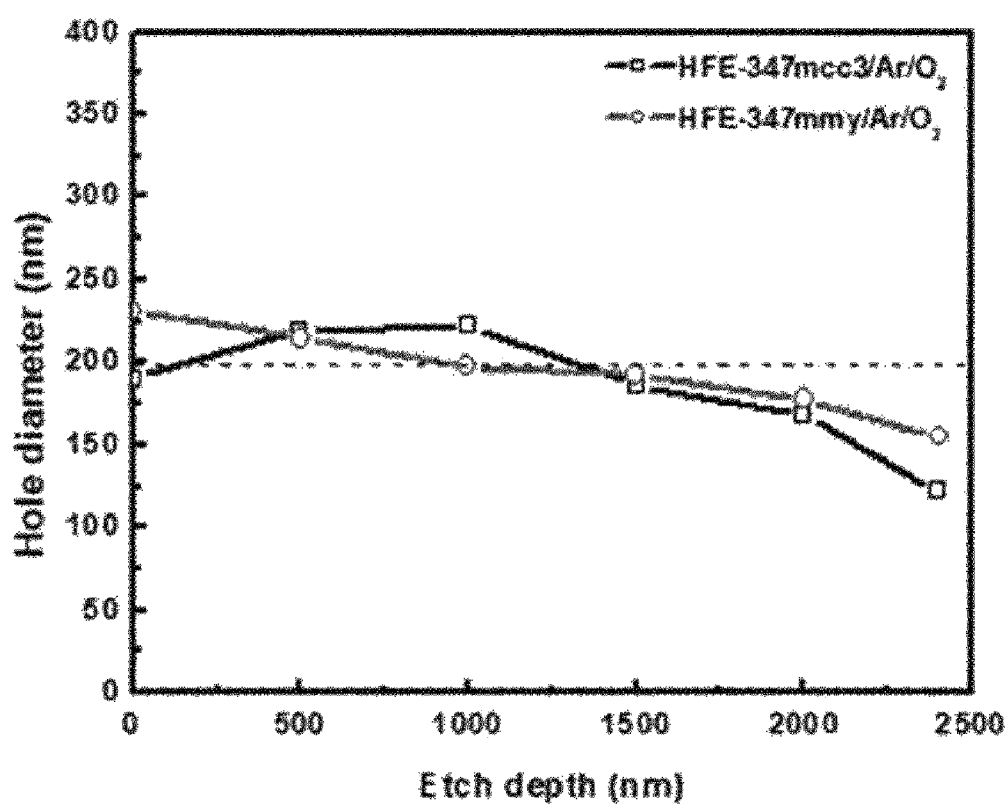

PLASMA ETCHING METHOD

CROSS REFERENCE TO RELATED APPLICATIONS

This application is a National Stage of International Application No. PCT/KR2020/007074 filed Jun. 1, 2020, claiming priority based on Korean Patent Application No. 10-2019-0101473 filed Aug. 20, 2019.

FIELD

The present disclosure relates to a plasma etching method using an etchant with a low global warming potential.

DESCRIPTION OF RELATED ART

Demand for a structure with a high aspect ratio is increasing due to high integration density of an integrated circuit and miniaturization of an element in a semiconductor device. In general, the high aspect ratio structure is formed in an insulating layer for electrically separating conductive layers from each other. In order to manufacture such a high aspect ratio structure, plasma etching of silicon oxide $SiO_2$ is widely used. Currently, in the plasma etching process of silicon oxide, perfluorocarbon (PFC) gases such as $CF_4$, $C_2F_6$, $C_3F_6$, $C_3F_8$, $C_4F_8$ are mainly used. The PFC gas generates various active species using plasma. In this connection, a fluorocarbon thin film as a carbon-based polymer thin film resulting from CFx active species is deposited on a substrate surface to protect a mask and serve as a source of etchant to improve a selectivity compared to the mask.

However, the fluorocarbon thin film deposited during plasma etching may hinder diffusion of reactive ions and radicals depending on a thickness, thereby lowering an etch rate. Further, the fluorocarbon thin film is excessively deposited on a sidewall of an etched structure to cause the etch stop. Thus, an etched depth may be smaller than a target depth. Further, a diameter of a bottom of the etched structure is smaller than a diameter of the mask.

Further, PFC is one of six greenhouse gases $CO_2$, $CH_4$, $N_2O$, HFC, PFC, and $SF_6$, and is chemically stable, and thus an average residence time thereof in the atmosphere is long. A global warming potential (GWP) thereof is very high and is higher by 6500 times than that of $CO_2$. Thus, the global warming effect thereof is great even at a small amount of emission thereof. However, an annual emission of PFC gas continues to increase as a proportion of the etching process in the semiconductor device manufacturing process increases. Accordingly, the emission of the PFC gas is lowered via various schemes such as decomposition, separation, and recovery of the discharged PFC gas. However, the reduction schemes of the emission thereof have fundamental limitation due to use of the PFC gas having the high GWP.

Therefore, a new etchant that may replace the conventional PFC gas, has low GWP, is eco-friendly, has excellent etching properties to form a high aspect ratio etched structure, and a plasma etching method using the same are required.

DISCLOSURE

Technical Purposes

One purpose of the present disclosure is to provide a plasma etching method using an etchant having a low global warming potential which replaces the conventional PFC gas having a high global warming potential.

Technical Solutions

A first aspect of the present disclosure provides a plasma etching method comprising: a first step of supplying a mixed gas containing vaporized heptafluoroisopropyl methyl ether gas having a molecular structure of a following Chemical Formula 1 and argon gas into a plasma chamber in which an etching target is disposed; and a second step of etching the etching target using plasma generated from the mixed gas:

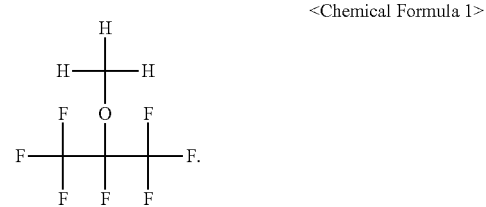 [SMILES: COC(F)(C(F)(F)F)C(F)(F)F]

<Chemical Formula 1>

In one embodiment of the first aspect, the heptafluoroisopropyl methyl ether gas and the argon gas are supplied to the chamber at a flow rate ratio in a range of 3:2 to 1:4.

In one embodiment of the first aspect, the heptafluoroisopropyl methyl ether gas and the argon gas are supplied to the chamber at a flow rate ratio in a range of 10.5:19.5 to 1:4.

In one embodiment of the first aspect, the mixed gas further contains oxygen gas.

In one embodiment of the first aspect, the heptafluoroisopropyl methyl ether gas and the oxygen gas are supplied to the chamber at a flow rate ratio in a range of 9:1 to 7:3.

In one embodiment of the first aspect, the etching target includes silicon oxide or silicon nitride.

In one embodiment of the first aspect, a hole pattern mask is formed on a surface of the etching target, wherein in the second step, a portion of the etching target exposed through the hole pattern mask is etched, such that a hole having a high aspect ratio is formed in the etching target, wherein the aspect ratio is defined as a ratio between a diameter and a depth of the hole, wherein the high aspect ratio is equal to or greater than 1:10.

A second aspect of the present disclosure provides a plasma etching method comprising: a first step of supplying a mixed gas containing vaporized heptafluoropropyl methyl ether gas having a molecular structure of a following Chemical Formula 2 and argon gas into a plasma chamber in which an etching target is disposed; and a second step of etching the etching target using plasma generated from the mixed gas:

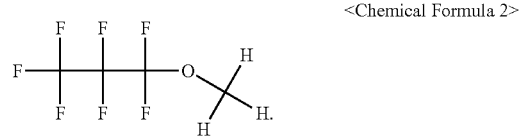

<Chemical Formula 2>

In one embodiment of the second aspect, the heptafluoropropyl methyl ether gas and the argon gas are supplied to the chamber at a flow rate ratio in a range of 2:3 to 1:9

In one embodiment of the second aspect, the heptafluoropropyl methyl ether gas and the argon gas are supplied to the chamber at a flow rate ratio in a range of 3:7 to 1:9.

In one embodiment of the second aspect, the mixed gas further contains oxygen gas.

In one embodiment of the second aspect, the heptafluoropropyl methyl ether gas and the oxygen gas are supplied to the chamber at a flow rate ratio in a range of 9:1 to 7:3

In one embodiment of the second aspect, the etching target includes silicon oxide or silicon nitride.

In one embodiment of the second aspect, a hole pattern mask is formed on a surface of the etching target, wherein in the second step, a portion of the etching target exposed through the hole pattern mask is etched, such that a hole having a high aspect ratio is formed in the etching target, wherein the aspect ratio is defined as a ratio between a diameter and a depth of the hole, wherein the high aspect ratio is equal to or greater than 1:10.

Technical Effects

According to the plasma etching method according to the present disclosure, HFE which has a global warming potential of 530 which is much lower than that of the PFC gas may be used to reduce the greenhouse gas emission, compared to the semiconductor manufacturing process using the existing PFC gas. Thus, the plasma etching may be performed in an eco-friendly manner. Further, according to the present disclosure, the plasma etching may be performed using the Ar gas together with HFE, such that the etching target may be etched using excellent etching properties. Further, change in a hole diameter based on an etching depth may be controlled by additionally using $O_2$ gas. When the plasma etching is performed using the hole pattern mask disposed on the etching target, a high aspect ratio etched structure having a very small or no difference between a diameter of the hole of the hole pattern mask and a diameter of the etched structure may be formed.

BRIEF DESCRIPTION OF THE DRAWINGS

FIG. 1 is a diagram showing a molecular structure and physical properties of HFE-347mcc3 plasma and HFE-347mmy plasma according to the present disclosure.

FIG. 2 shows a schematic diagram of a plasma etching apparatus for performing a plasma etching method according to an embodiment of the present disclosure.

FIG. 3 is a diagram for illustrating an etch rate based on a bias voltage in each of HFE-347mcc3 plasma and HFE-347mmy plasma according to the present disclosure.

FIG. 4 is a diagram for illustrating an etch rate of $SiO_2$ based on an Ar flow rate in each of HFE-347mcc3 plasma and HFE-347mmy plasma according to the present disclosure.

FIG. 5 is a diagram for illustrating etch rates of $SiO_2$, $Si_3N_4$ and ACL based on a source power in each of HFE-347mcc3/Ar plasma and HFE-347mmy/Ar plasma according to the present disclosure.

FIG. 6 is a diagram for illustrating an etch selectivity of each of $SiO_2$/ACL and $Si_3N4$/ACL based on a source power in each of HFE-347mcc3/Ar plasma and HFE-347mmy/Ar plasma according to the present disclosure.

FIG. 7 is a diagram for illustrating etch rates of $SiO_2$, $Si_3N_4$ and ACL based on a bias voltage in each of HFE-347mcc3/Ar plasma and HFE-347mmy/Ar plasma according to the present disclosure.

FIG. 8 is a diagram for illustrating an etch selectivity of each of $SiO_2$/ACL and $Si_3N_4$/ACL based on a bias voltage in each of HFE-347mcc3/Ar plasma and HFE-347mmy/Ar plasma according to the present disclosure.

FIG. 9 is a diagram for illustrating a thickness of a steady-state fluorocarbon thin film based on a bias voltage in each of HFE-347mcc3/Ar plasma and HFE-347mmy/Ar plasma according to the present disclosure.

FIG. 10 is a FE-SEM image of a hole pattern mask specimen having a diameter of 200 nm used for fabricating a high aspect ratio etched structure using each of HFE-347mcc3/Ar plasma and HFE-347mmy/Ar plasma according to the present disclosure.

FIGS. 11A and 11B are views showing a result of a high aspect ratio etched structure using each of HFE-347mcc3/Ar plasma and HFE-347mmy/Ar plasma according to the present disclosure. FIG. 11A shows a hole etching profile of the high aspect ratio etched structure, and FIG. 11B shows change in a hole diameter based on an etching depth.

FIGS. 12A and 12B are views showing a result of a high aspect ratio etched structure using each of HFE-347/Ar/$O_2$ plasma and HFE-347mmy/Ar/$O_2$ plasma according to the present disclosure. FIG. 12A shows a hole etching profile of a high aspect ratio etched structure, and FIG. 12B shows change in a hole diameter based on the etching depth.

DETAILED DESCRIPTIONS

Hereinafter, an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The present disclosure relates to a high aspect ratio plasma etching method using hydrofluoroether (hereinafter referred to as HFE) having a global warming potential (GWP) lower than that of the conventional perfluorocarbon (PFC). The hydrofluoroether (HFE) used in the plasma etching method according to the present disclosure includes hydrofluoroether (HFE-347) which is composed of 4 carbons, 3 hydrogens, 1 oxygen and 7 fluorines, and is present in a liquid state at room temperature.

FIG. 1 is a diagram showing the molecular structure and properties of HFE-347 used in the plasma etching method according to the present disclosure, and FIG. 2 is a schematic diagram of a plasma etching apparatus for performing the plasma etching method according to an embodiment of the present disclosure.

Referring to FIG. 1 and FIG. 2, the plasma etching method in accordance with the present disclosure includes a first step of supplying a mixed gas containing vaporized heptafluoroisopropyl methyl ether gas (hereinafter referred to as HFE-347mmy) having a molecular structure of a following Chemical Formula 1 or vaporized heptafluoropropyl methyl ether gas (hereinafter referred to as HFE-347mcc3) having a molecular structure of a following Chemical Formula 2 and argon gas into a plasma chamber in which an etching target is disposed; and a second step of etching the etching target using plasma generated from the mixed gas:

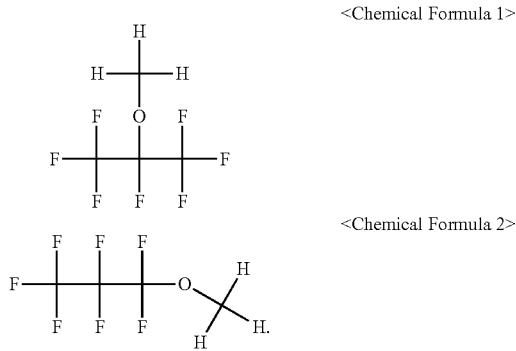

<Chemical Formula 1>

<Chemical Formula 2>

In the first step, in order to provide HFE-347 vapor to the plasma chamber, the liquid HFE-347 may be vaporized by heating a container containing the liquid HFE-347 and a chamber connection line connecting the container and the plasma chamber. Because HFE-347 has a boiling point of 29° C. to 34° C. and has a liquid phase at room temperature, vaporization of the liquid HFE-347 is performed to uniformly introduce the vaporized liquid HFE-347 into the plasma chamber. In one embodiment, the vaporization of the liquid HFE-347 according to the present disclosure may be performed by heating a canister containing the liquid HFE-347 and the chamber connection line connecting the canister and the plasma etching chamber. In this connection, the canister may be heated to a temperature above the boiling point of the HFE-347 so that the liquid HFE-347 may be vaporized. The chamber connection line may be heated to a higher temperature than a temperature to which the canister may be heated, so that the flow rate does not fluctuate due to droplet splashing inside the plasma chamber. For example, the canister may be heated to 75° C., and the chamber connection line may be heated to 90° C. In this connection, the canister may be heated using a heating jacket. The vaporized HFE-347, that is, the HFE-347 vapor may be supplied into the plasma chamber. In this connection, a mass flow controller may be installed just before the plasma chamber. Thus, the vaporized HFE-347 may be fed to the chamber while maintaining a constant flow rate of the vaporized HFE-347.

The mixed gas containing the Ar gas as dilution gas and the vaporized HFE-347 may be supplied into the plasma chamber. Injecting the Ar gas may result in increase in a plasma density in the plasma etching process, thereby easily controlling an etch rate. The Ar gas may be injected into the chamber in a separate manner from the HFE-347 via a separate Ar gas injection line connected to the plasma chamber.

In an embodiment, when the heptafluoroisopropyl methyl ether gas represented by the Chemical Formula 1 is used, the heptafluoroisopropyl methyl ether gas and the Ar gas may be supplied into the plasma chamber at a flow rate ratio in a range of 3:2 to 1:4. Preferably, the flow rate ratio of the heptafluoroisopropyl methyl ether gas and the Ar gas may be in a range of 10.5:19.5 to 1:4. Further, when using the heptafluoropropyl methyl ether gas represented by the Chemical Formula 2, the heptafluoropropyl methyl ether gas and the Ar gas may be supplied into the plasma chamber at a flow rate ratio in a range of 2:3 to 1:9. Preferably, the flow rate ratio of the heptafluoropropyl methyl ether gas and the Ar gas may be in a range of 3:7 to 1:9.

In the first step, the mixed gas may further contain $O_2$ gas. Injecting the $O_2$ gas into the plasma chamber may control a steady state hydrogen fluoride thin film by the plasma etching and thus may be effective in controlling a hole diameter of the high aspect ratio etched structure. In this case, the $O_2$ gas may be injected into the plasma chamber in a separate manner from the HFE-347 gas and the Ar gas via a separate $O_2$ gas injection line connected to the plasma chamber. The heptafluoroisopropyl methyl ether having the molecular structure of the Chemical Formula 1 and the $O_2$ gas may be supplied to the chamber at a flow rate ratio in a range of 9:1 to 7:3. The heptafluoropropyl methyl ether having the molecular structure of the Chemical Formula 2 and the $O_2$ gas may be supplied to the chamber at a flow rate ratio in a range of 9:1 to 7:3.

In the second step, the etching target may include any material that may be etched using the plasma etching method according to the present disclosure. However, preferably, the etching target may include, for example, silicon oxide such as silicon dioxide or silicon nitride.

Further, in the plasma etching method according to the present disclosure, the hole pattern mask may be formed on the surface of the etching target. In the second step, a portion of the etching target exposed through the hole pattern mask is etched, such that a hole having a high aspect ratio is formed in the etching target, wherein the aspect ratio is defined as a ratio between a diameter and a depth of the hole, wherein the high aspect ratio is equal to or greater than 1:10.

According to the present disclosure, the HFE-347 which has a global warming potential of 530 which is much lower than that of the PFC gas, the Ar gas, and the $O_2$ gas may be used to perform the plasma etching process, thereby reducing the greenhouse gas emission, compared to the semiconductor manufacturing process using the existing PFC gas. Thus, the plasma etching process may be eco-friendly. Further, the plasma etching may be carried out so as to exhibit excellent etching characteristics. In particular, according to the plasma etching process according to the present disclosure, the deposition rate of the fluorocarbon thin film on the etching target may be reduced and the etch rate thereof may be increased to appropriately controlling a thickness of the steady-state fluorocarbon thin film. When the plasma etching of the etching target is performed using the hole pattern mask formed on the etching target, the high aspect ratio etched structure having the hole diameter little or no difference from the diameter of the hole pattern mask may be formed. A more detailed description thereof will be described with reference to Examples and Experimental Examples of the present disclosure below.

Hereinafter, a basic etch rate using HFE-347, an etch rate and a selectivity based on a process condition, and a plasma etching method for producing an optimal high aspect ratio etched structure via high aspect ratio etching will be described.

Experimental Example 1: Basic Etch Rate Using Each of HFE-347mcc3 Plasma and HFE-347mmy Plasma To identify the basic etch rates of HFE-347mcc3 plasma and HFE-347mmy plasma, respectively, plasma etching of $SiO_2$ was performed based on a bias voltage. Specifically, each of the HFE-347mcc3 gas and the HFE-347 gas was supplied to the plasma chamber while changing the bias voltage, such that the $SiO_2$ thin film was plasma-etched. Specific plasma etching process conditions are shown in Table 1 below, and the etch rates using the HFE-347mcc3 plasma and the HFE-347mmy plasma are shown in FIG. 3.

TABLE 1

| Source power (W) | Bias voltage (V) | Discharge Gas | Total Flow Rate (sccm) | Pressure (mTorr) | Substrate Temperature (° C.) |
|---|---|---|---|---|---|
| 250 | −600 | HFE-347mcc3 HFE-347mmy | 30 | 10 | 15 |

The total flow rate, the pressure, and the substrate temperature presented in Table 1 are only examples of the present disclosure, and the present disclosure is not necessarily limited thereto. The total flow rate, the pressure, and the substrate temperature presented in the present disclosure may vary based on types of plasma etching apparatuses.

FIG. 3 is a diagram for illustrating change in the etch rate of $SiO_2$ based on the bias voltage using each of HFE-347mcc3 plasma and HFE-347mmy plasma.

Referring to FIG. 3, it may be identified that when $SiO_2$ is etched using each of HFE-347mcc3 plasma and HFE-347mmy plasma, the deposition rate gradually increases as the bias voltage increases.

However, when only HFE-347 plasma was used, $SiO_2$ was not etched under all bias voltage conditions, but the deposition occurs on the $SiO_2$ surface. Therefore, in accordance with the present disclosure, $SiO_2$ etching was performed by adding the argon (Ar) as the dilution gas in order to remove the phenomenon of the deposition on the $SiO_2$ surface.

Further, while changing the flow rate of the Ar gas into the chamber, the $SiO_2$ etching was performed. The $SiO_2$ was plasma-etched using each of HFE-347mcc3 plasma and HFE-347mmy plasma. Specific plasma etching process conditions are shown in Table 2, and the etch rate based on the Ar flow rate is shown in FIG. 4.

TABLE 2

| Source power (W) | Bias voltage (V) | Discharge Gas | Total Flow Rate (sccm) | Pressure (mTorr) | Substrate Temperature (° C.) |
|---|---|---|---|---|---|
| 250 | −600 | HFE-347mcc3/Ar HFE-347mmy/Ar | 30 | 10 | 15 |

The total flow rate, the pressure, and the substrate temperature presented in Table 2 are only examples of the present disclosure, and the present disclosure is not necessarily limited thereto. The total flow rate, the pressure, and the substrate temperature presented in the present disclosure may vary based on types of plasma etching apparatuses.

FIG. 4 is a diagram for illustrating an etch rate of $SiO_2$ based on an Ar flow rate when each of HFE-347mcc3/Ar plasma and HFE-347mmy/Ar plasma is used according to the present disclosure.

Referring to FIG. 4, it may be identified that when using the HFE-347mcc3/Ar plasma, the $SiO_2$ etch rate starts to increase when the Ar flow rate percentage is 60% or greater. However, the etch rate decreases when the Ar flow rate percentage is 80% or greater. On the other hand, it may be identified that when using HFE-347mmy/Ar plasma, the $SiO_2$ etch rate starts to increase when the Ar flow rate percentage is 50% or greater. However, it may be identified that when the Ar flow rate percentage is 80% or greater, the etch rate decreases, which is the case in HFE-347mcc3/Ar. That is, an amount of the etchant that may etch $SiO_2$ decreases when the Ar flow rate percentage is 80% or greater, such that the etch rate may be lowered.

Further, it may be identified that when using each of HFE-347mcc3/Ar plasma and HFE-347mmy/Ar plasma, $SiO_2$ is etched rapidly at a point (each of HFE-347mcc3 and HFE-347mmy 10 sccm, and Ar 20 sccm) where the Ar flow rate percentage is 67%. That is, according to the present disclosure, it may be identified that it is most preferable to provide the HFE-347 gas and the Ar gas into the plasma chamber at a flow rate ratio of 1:2. It may be expected that when the HFE-347 gas and the Ar gas are supplied to the chamber at a flow rate ratio of 1:2, the etching target may be etched at an excellent etch rate.

Hereinafter, the Ar flow rate percentage was 67% (that is, when the total flow rate was 30 sccm, the flow rate of each of HFE-347mcc3 gas and HFE-347mmy gas was 10 sccm, and the Ar flow rate 20 was sccm).

Experimental Example 2: Etch Rate and Etch Selectivity Based on Source Power when Using Each of HFE-347mcc3/Ar Plasma and HFE-347mmy/Ar Plasma Then, in order to identify the etch rate based on the source power when using each of HFE-347mcc3/Ar plasma and HFE-347mmy/Ar plasma, the Ar flow rate was set to be 67% of the total flow rate (that is, Ar flow rate 20 sccm) and the HFE-347 flow rate was fixed to 10 sccm, and the source power varied. In HFE-347mcc3/Ar plasma and HFE-347mmy/Ar plasma etching according to the present disclosure, the etch rates of $SiO_2$, $Si_3N_4$ and an amorphous carbon layer (ACL) based on the source power were identified. Specific etching process conditions are shown in Table 3 below, and the etch rate is shown in FIG. 5.

TABLE 3

| Source power (W) | Bias voltage (V) | Discharge Gas (X/Y) | Total Flow Rate (sccm) | Pressure (mTorr) | Substrate Temperature (° C.) |
|---|---|---|---|---|---|
| 200 to 500 | −600 | HFE-347mcc3/Ar HFE-347mmy/Ar | 30 (X/Y = 10/20) | 10 | 15 |

The total flow rate, the pressure, and the substrate temperature presented in Table 2 are only examples of the present disclosure, and the present disclosure is not necessarily limited thereto. The total flow rate, the pressure, and the substrate temperature presented in the present disclosure may vary based on types of plasma etching apparatuses.

FIG. 5 is a diagram for illustrating the etch rate based on the source power when using each of HFE-347mcc3/Ar plasma and HFE-347mmy/Ar plasma.

Referring to FIG. 5, it may be identified that the etch rate increases as the source power increases. It may be identified that when using each of HFE-347mcc3/Ar plasma and HFE-347mmy/Ar plasma, there is a point where curves indicating the etch rates of $SiO_2$ and $Si_3N_4$ intersect each other. It may be identified that except for the source power condition of about 250 W or lower, the etch rate of $Si_3N_4$ is greater than the etch rate of $SiO_2$. It may be identified that when comparing the plasma etch rates of $SiO_2$ and $Si_3N_4$, HFE-347mmy/Ar plasma has higher etch rates of $SiO_2$ and $Si_3N_4$ than HFE-347mcc3/Ar has.

Further, the etch selectivity of each of HFE-347mcc3/Ar plasma and HFE-347mmy/Ar plasma based on a source power was calculated based on the etch rates of $SiO_2$, $Si_3N_4$ and ACL as shown in FIG. 5. The etch selectivity of each of $SiO_2$/ACL and $Si_3N_4$/ACL relative to ACL used as an etching mask was calculated. The results are shown in FIG. 6.

Referring to FIG. 6, it may be identified that at 200 W source power, both HFE-347mmy/Ar plasma and HFE-347mcc3/Ar plasma are deposited on ACL, so that the etch selectivity thereof is infinite. It may be identified that in other source power conditions, the HFE-347mmy/Ar plasma has greater etch selectivity than the HFE-347mcc3/Ar plasm has.

Experimental Example 3: Etch Rate and Etch Selectivity Based on Bias Voltage when Using Each of HFE-347mcc3/Ar Plasma and HFE-347mmy/Ar Plasma To identify the etch rate based on the bias voltage when using each of HFE-347mcc3/Ar plasma and HFE-347mmy/Ar plasma, the Ar flow rate was set to 67% of the total flow rate (Ar flow rate was 20 sccm) and HFE-347 flow rate was fixed to 10 sccm. The bias voltage varied. In the HFE-347/Ar plasma etching according to the present disclosure, the etch rates of $SiO_2$, $Si_3N_4$, and ACL (Amorphous Carbon Layer) based on the bias voltage were identified. Specific etching process conditions are shown in Table 4 below, and the etch rate is shown in FIG. 7.

TABLE 4

| Source power (W) | Bias voltage (V) | Discharge Gas (X/Y) | Total Flow Rate (sccm) | Pressure (mTorr) | Substrate Temperature (° C.) |
|---|---|---|---|---|---|
| 250 | −400 to −1200 | HFE-347mcc3/Ar HFE-347mmy/Ar | 30 (X/Y = 10/20) | 10 | 15 |

The total flow rate, the pressure, and the substrate temperature presented in Table 2 are only examples of the present disclosure, and the present disclosure is not necessarily limited thereto. The total flow rate, the pressure, and the substrate temperature presented in the present disclosure may vary based on types of plasma etching apparatuses.

FIG. 7 is a diagram for illustrating the etch rate based on the bias voltage when using each of HFE-347mcc3/Ar plasma and HFE-347mmy/Ar plasma.

Referring to FIG. 7, it may be identified that the etch rate increases as the bias voltage increases. It may be identified that the etch rates of $SiO_2$ and $Si_3N_4$ when using HFE-347mmy/Ar plasma and HFE-347mcc3/Ar plasma were substantially similar to each other at a bias voltage of −400 V. It may be identified that the etch rates of $Si_3N_4$ when using each of HFE-347mmy/Ar plasma and HFE-347mcc3/Ar plasma have substantially similar values, while the etch rate of $SiO_2$ when using HFE-347mmy/Ar plasma is greater than the etch rate of $SiO_2$ when using HFE-347mcc3/Ar.

Further, the etch selectivity based on the bias voltage when using each of HFE-347mcc3/Ar plasma and HFE- 347mmy/Ar plasma was calculated based on the etch rates of $SiO_2$, $Si_3N_4$, and ACL as shown in FIG. 7. The etch selectivity of each of $SiO_2$/ACL and $Si_3N_4$/ACL relative to ACL used as an etching mask was calculated. The results are shown in FIG. 8.

Referring to FIG. 8, it may be identified that each of HFE-347mmy/Ar plasma and HFE-347mcc3/Ar plasma is deposited on ACL at −400 V bias voltage, such that the etch selectivity thereof is infinite. It may be identified that in a similar manner to the etch selectivity based on the source power as shown in FIG. 6, HFE-347mmy/Ar plasma has greater etch selectivity than HFE-347mcc3/Ar plasma has.

Experimental Example 4: Thickness of Steady-State Fluorocarbon Film Based on Bias Voltage when Using Each of HFE-347mcc3/Ar Plasma and HFE-347mmy/Ar Plasma First, the steady-state fluorocarbon thin film refers to a thin film formed on the substrate surface due to $CF_x$ radicals when Si, $SiO_2$ and $Si_3N_4$ are etched under fluorocarbon plasma. The steady-state fluorocarbon thin film serves as a source of the etchant and at the same time prevents diffusion of reactive ions and radicals.

To measure the thickness of the steady-state fluorocarbon thin film, the Ar flow rate was set to be 67% of the total flow rate (Ar flow rate was 20 sccm), and $SiO_2$ etching was performed based on the bias voltage when using each of HFE-347mcc3/Ar plasma and HFE-347mmy/Ar plasma according to the present disclosure. Then, the thickness of the steady-state fluorocarbon thin film formed on the surface of $SiO_2$ was measured. Specific process conditions are the same as in Table 4, and the results are shown in FIG. 9.

Referring to FIG. 9, it may be identified that the thickness of the steady-state fluorocarbon thin film formed on the surface of $SiO_2$ when using HFE-347mmy/Ar plasma is similar to that when using HFE-347mcc3/Ar plasma. The thick steady-state fluorocarbon thin film means that an amount of $CF_2$ radicals generated in the plasma is large. As the number of $CF_2$ radicals increases, the amount of the steady-state fluorocarbon thin film formed on the surface of the ACL increases, which may be expected to cause inhibition of the ACL etching.

Experimental Example 5: Etching Using Each of HFE-347mcc3/Ar Plasma and HFE-347mmy/Ar Plasma To fabricate a high aspect ratio etched structure via the etching process using HFE-347/Ar plasma according to the present disclosure, first, the hole pattern mask was formed on a specimen (a $SiO_2$ thin film). The formed hole pattern mask was imaged using FE-SEM, and the result is shown in FIG. 10.

Referring to FIG. 10, it may be identified that the hole pattern mask has a total thickness of 1400 nm, and has a stack structure in which a 50 nm SiON thin film is formed on 1350 nm ACL, and the hole pattern mask is formed on a 2400 nm $SiO_2$ thin film. In addition, it may be identified that the hole diameter of the formed hole pattern mask is 200 nm.

The high aspect ratio etching using the HFE-347/Ar plasma was identified using the specimen ($SiO_2$ thin film) on which the hole pattern mask as prepared as described above was formed. Specifically, the plasma etching was performed under conditions shown in Table 5 below. The result is shown in FIGS. 11A and 11B.

TABLE 5

| Source power (W) | Bias voltage (V) | Discharge Gas (X/Y) | Total Flow Rate (sccm) | Pressure (mTorr) | Substrate Temperature (° C.) | Etching time (min) |
|---|---|---|---|---|---|---|
| 250 | −1200 | HFE-347mcc3/Ar HFE-347mmy/Ar | 30 (X/Y = 10/20) | 10 | 15 | 12 |

The total flow rate, the pressure, and the substrate temperature presented in Table 2 are only examples of the present disclosure, and the present disclosure is not necessarily limited thereto. The total flow rate, the pressure, and the substrate temperature presented in the present disclosure may vary based on types of plasma etching apparatuses.

Referring to FIG. 11A, it may be identified that when the $SiO_2$ thin film is etched using each of HFE-347mcc3/Ar plasma and HFE-347mmy/Ar plasma for 12 minutes, the $SiO_2$ thin film is etched to a bottom of the $SiO_2$ thin film having a depth of 2400 nm.

Referring to FIG. 11B, the hole diameter change based on the etching depth is identified. It may be identified that when using each of HFE-347mcc3/Ar plasma and HFE-347mmy/Ar plasma, a diameter of the etched structure at the etching depth of 0 nm (in this connection, a boundary between the hole pattern mask and the $SiO_2$ thin film is set to the etching depth of 0 nm) is substantially similar to the hole diameter (200 nm) of the hole pattern mask before the etching. It may be identified that when using each of HFE-347mcc3/Ar plasma and HFE-347mmy/Ar plasma, the hole diameter of the etched structure decreases as the etching depth increases. Specifically, it may be identified that when using the HFE-347mcc3/Ar plasma, the hole diameter of the etched structure gradually decreases as the structure reaches the depth of 2400 nm as the bottom of the $SiO_2$ thin film, whereas when using the HFE-347mmy/Ar plasma, the change in the hole diameter of the etched structure is not large as the etching depth increases after the etching depth reaches 1000 nm.

Experimental Example 6: Etching Using HFE-347/Ar/$O_2$ Plasma and HFE-347mmy/Ar/$O_2$ Plasma Accordingly, in accordance with the present disclosure, when using each of the HFE-347mcc3/Ar plasma and the HFE-347mmy/Ar plasma, the change in the hole diameter of the etched structure according to the etching depth is reduced compared to that before the etching. Thus, the high aspect ratio etching was performed while additionally adding $O_2$. The high aspect ratio etching was performed under the same process conditions as those Experimental Example 5, except that $O_2$ was additionally added. Specific process conditions are shown in Table 6. The results are shown in FIGS. 12A and 12B.

TABLE 6

| Source power (W) | Bias voltage (V) | Discharge Gas (X/Y) | Total Flow Rate (sccm) | Pressure (mTorr) | Substrate Temperature (° C.) | Etching time (min) |
|---|---|---|---|---|---|---|
| 250 | −1200 | HFE-347mcc3/Ar/O$_2$ HFE-347mmy/Ar/O$_2$ | 30 (X/Y = 10/20) | 10 | 15 | 12 |

The total flow rate, the pressure, and the substrate temperature presented in Table 2 are only examples of the present disclosure, and the present disclosure is not necessarily limited thereto. The total flow rate, the pressure, and the substrate temperature presented in the present disclosure may vary based on types of plasma etching apparatuses.

Referring to FIG. 12A, it may be identified that when etching the SiO$_2$ thin film for 12 minutes using each of the FE-347mcc3/Ar/O$_2$ plasma and HFE-347mmy/Ar/O$_2$ plasma, the SiO$_2$ thin film is etched to a bottom thereof having a depth of 2400 nm, which is the same as the result shown in FIG. 11A.

Referring to FIG. 12B, it may be identified that bowing phenomenon occurs when using the HFE-347mcc3/Ar/O$_2$ plasma, the hole diameter of the etched structure becomes larger than 200 nm in a range of an etching depth of 500 to 1500 nm. It may be identified that the hole diameter of the etched structure becomes smaller than 200 nm in a range of an etching depth of 2000 nm or greater. It may be identified that when using the HFE-347mmy/Ar/O$_2$ plasma, the hole diameter of the etched structure is slightly larger only at the etching depth of 0 nm which is the boundary between the hole pattern mask and SiO$_2$, and the hole diameter change according to the etching depth is greatest in a region near 200 nm. Further, it may be identified that a profile obtained from etching using the HFE-347mmy/Ar/O$_2$ plasma has the straightest shape.

As identified above, it may be identified that the HFE-347mmy plasma has a higher etch rate based on each of the source power and the bias voltage, compared to that when using the HFE-347mcc3 plasma. Further, it may be identified that the HFE-347mmy plasma has the etching profile straighter than that when using the HFE-347mcc3 plasma. These results may be expected based on the molecular structures of HFE-347mmy plasma and HFE-347mcc3 plasma. The HFE-347mmy plasma has the molecular structure in which CF$_3$ is connected to each of both ends of the molecule, and thus has an advantageous molecular structure capable of generating CF$_3{}^+$ ions, whereas HFE-347mcc3 has a molecular structure in which CF$_3$ is connected to one end of the molecule. In this connection, the CF$_3{}^+$ ions have a high etching yield when etching SiO$_2$ and Si$_3$N$_4$, and thus greatly affect the etching. Therefore, the HFE-347mmy plasma in which CF$_3$ is connected to each of both ends of the molecule may generate a larger number of CF$_3{}^+$ ions than the HFE-347mcc3 plasma may. Thus, the above results may be expected.

Although the disclosure has been described above with reference to the preferred embodiments of the present disclosure, those skilled in the art may variously modify and change the present disclosure within the scope without departing from the spirit of the present disclosure as described in the claims below.

What is claimed is:

1. A plasma etching method comprising:
    a first step of supplying a mixed gas consisting of (i) vaporized heptafluoroisopropyl methyl ether gas having a molecular structure of a following Chemical Formula 1, (ii) argon gas and (iii) oxygen gas into a plasma chamber in which an etching target is disposed; and
    a second step of etching the etching target using plasma generated from the mixed gas:

<Chemical Formula 1>

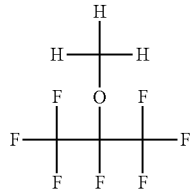

wherein the heptafluoroisopropyl methyl ether gas and the argon gas are supplied to the chamber at a flow rate ratio in a range of 10.5:19.5 to 1:4,
    wherein the heptafluoroisopropyl methyl ether gas and the oxygen gas are supplied to the chamber at a flow rate ratio in a range of 9:1 to 7:3, and
    wherein the second step of etching the etching target is performed based on a source power in a range of 250 W to 500 W, and a bias voltage in a range of −400V to −1200V.

2. The method of claim 1, wherein the etching target includes silicon oxide or silicon nitride.

3. The method of claim 1, wherein a hole pattern mask is formed on a surface of the etching target,
    wherein in the second step, a portion of the etching target exposed through the hole pattern mask is etched, such that a hole having a high aspect ratio is formed in the etching target, wherein the aspect ratio is defined as a ratio between a diameter and a depth of the hole, wherein the high aspect ratio is equal to or greater than 1:10.

4. The method of claim 1, wherein the source power is in a range of 300 W to 500 W, and the bias voltage is in a range of −800V to −1200V.

5. The method of claim 1, wherein the heptafluoroisopropyl methyl ether gas and the argon gas are supplied to the chamber at a flow rate ratio of 1:2.

6. A plasma etching method comprising:
    a first step of supplying a mixed gas consisting of (i) vaporized heptafluoropropyl methyl ether gas having a molecular structure of a following Chemical Formula 2, (ii) argon gas and (iii) oxygen gas into a plasma chamber in which an etching target is disposed; and a second step of etching the etching target using plasma generated from the mixed gas:

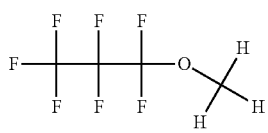

<Chemical Formula 2> wherein the heptafluoropropyl methyl ether gas and the argon gas are supplied to the chamber at a flow rate ratio in a range of 3:7 to 1:9, wherein the heptafluoropropyl methyl ether gas and the oxygen gas are supplied to the chamber at a flow rate ratio in a range of 9:1 to 7:3, and wherein the second step of etching the etching target is performed based on a source power in a range of 250 W to 500 W, and a bias voltage in a range of −400V to −1200V.

7. The method of claim 6, wherein the etching target includes silicon oxide or silicon nitride.

8. The method of claim 6, wherein a hole pattern mask is formed on a surface of the etching target, wherein in the second step, a portion of the etching target exposed through the hole pattern mask is etched, such that a hole having a high aspect ratio is formed in the etching target, wherein the aspect ratio is defined as a ratio between a diameter and a depth of the hole, wherein the high aspect ratio is equal to or greater than 1:10.

9. The method of claim 6, wherein the source power is in a range of 300 W to 500 W, and the bias voltage is in a range of −800V to −1200V.

* * * * *